US009798839B2

(12) United States Patent
Ramamurthy (10) Patent No.: US 9,798,839 B2
(45) Date of Patent: Oct. 24, 2017

(54) SYSTEM AND METHODS OF GENERATING A COMPUTER MODEL OF A COMPONENT

(71) Applicant: General Electric Company, Schenectady, NY (US)

(72) Inventor: Rajesh Ramamurthy, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 1018 days.

(21) Appl. No.: 14/076,687

(22) Filed: Nov. 11, 2013

(65) Prior Publication Data

US 2015/0134301 A1  May 14, 2015

(51) Int. Cl.
*G06F 7/50* (2006.01)
*G06F 17/10* (2006.01)
*G06F 17/50* (2006.01)

(52) U.S. Cl.
CPC ................ *G06F 17/5009* (2013.01)

(58) Field of Classification Search
CPC .................................. G06F 17/5009
USPC ............................................. 703/2
See application file for complete search history.

(56) References Cited

U.S. PATENT DOCUMENTS

| | | | |
|---|---|---|---|
| 5,452,218 A | 9/1995 | Tucker et al. | |
| 6,353,767 B1 | 3/2002 | Wakeman et al. | |
| 6,393,331 B1 | 5/2002 | Chetta et al. | |
| 6,466,927 B1 | 10/2002 | Dougherty et al. | |
| 6,643,615 B1 | 11/2003 | Bauer et al. | |
| 6,656,409 B1 | 12/2003 | Keicher et al. | |
| 6,691,127 B1 | 2/2004 | Bauer et al. | |
| 6,804,574 B2 | 10/2004 | Cheng et al. | |
| 6,823,287 B2 | 11/2004 | Shafer et al. | |
| 6,856,842 B2 | 2/2005 | Rebello et al. | |
| 7,041,933 B2 | 5/2006 | Forrester et al. | |
| 7,110,956 B1 | 9/2006 | Drake, Jr. et al. | |
| 7,219,043 B2 | 5/2007 | Rebello et al. | |
| 8,247,780 B2 | 8/2012 | Zhang et al. | |

(Continued)

OTHER PUBLICATIONS

Lee, Ki-Don, and Kwang-Yong Kim. "Shape optimization of a fan-shaped hole to enhance film-cooling effectiveness." International Journal of Heat and Mass Transfer 53, No. 15 (2010): 2996-3005.*

(Continued)

*Primary Examiner* — Aniss Chad
(74) *Attorney, Agent, or Firm* — John P. Darling (57) ABSTRACT

A computer device for generating a computer model of a non-nominal component includes a memory device and a communication interface device coupled to the memory device and includes a processor. The processor is programmed to generate a nominal outer surface and a nominal inner surface; generate a tool having a first tool position; move the tool to a second tool position within the nominal component, the second tool position based on a simulated local geometric deviation of a parameter; segment the tool into a first portion and a second portion at the nominal inner surface component; return the first portion to the first tool position out of the nominal component; segment the first portion at the nominal outer surface into a hole portion; and simulate a non-nominal cooling hole represented by the hole portion to facilitate computer modeling of the non-nominal component.

12 Claims, 11 Drawing Sheets

(56) References Cited

U.S. PATENT DOCUMENTS

| | | | |
|---|---|---|---|
| 9,310,312 B2* | 4/2016 | Jahnke | G01N 21/8851 |
| 2003/0149498 A1 | 8/2003 | Rebello et al. | |
| 2003/0149502 A1 | 8/2003 | Rebello et al. | |
| 2004/0200807 A1 | 10/2004 | Forrester et al. | |
| 2006/0229759 A1 | 10/2006 | Luketic et al. | |
| 2007/0003690 A1* | 1/2007 | D'Amour | B23P 6/007 |
| | | | 427/140 |
| 2011/0099810 A1 | 5/2011 | Stankowski et al. | |
| 2011/0185572 A1 | 8/2011 | Wei et al. | |
| 2015/0000387 A1* | 1/2015 | Jiang | F01D 5/147 |
| | | | 73/112.01 |

OTHER PUBLICATIONS

Narzary, Diganta Prakash. "Experimental Study of Gas Turbine Blade Film Cooling and Heat Transfer." PhD diss., Texas A&M University, 2009.*

Hasanpour, A., M. Farhadi, and H. R. Ashorynejad. "Hole configuration effect on turbine blade cooling." World Academy of Science, Engineering and Technology 49 (2011): 1-6.*

Lu, Yiping. "Effect of hole configurations on film cooling from cylindrical inclined holes for the application to gas turbine blades." PhD diss., Louisiana State University, 2007.*

Abdelghany, Eslam, Ahmed F. Ei-Sayed, Mahmoud A. Fouad, and Essam E. Khalil. "Effect of Shaped-Hole on Film Cooling Effectiveness of Gas Turbine Blade." In 10th International Energy Conversion Engineering Conference, p. 3986. 2012.*

Christophel, J. R., K. A. Thole, and F. J. Cunha. "Cooling the Tip of a Turbine Blade Using Pressure Side Holes—Part I: Adiabatic Effectiveness Measurements." Journal of turbomachinery 127, No. 2 (2005): 270-277.*

Christophel, J. R., K. A. Thole, and F. J. Cunha. "Cooling the Tip of a Turbine Blade Using Pressure Side Holes: Part 2—Heat Transfer Measurements." In ASME Turbo Expo 2004: Power for Land, Sea, and Air, pp. 273-282. American Society of Mechanical Engineers, 2004.*

Zhao, et al., Prediction of Assembly Variation During Early Design, Journal of Computing and Information Science in Engineering, Sep. 2009, pp. 031003-1-031003-11, vol. 9.

* cited by examiner

SYSTEM AND METHODS OF GENERATING A COMPUTER MODEL OF A COMPONENT

BACKGROUND

The embodiments described herein relate generally to computer modeling, and more particularly, to systems and methods for generating a computer model of a local component of a turbine engine to account for actual manufacturing tolerances during a computer modeling stage of the component.

In a gas turbine, hot combustion gases flow along an annular hot gas path. Typically, turbine stages are disposed along the hot gas path such that the gases flow through vanes and blades of the turbine stages. The temperature of the hot gas may approach or exceed the permissible material temperature of the turbine blades. To accommodate the hot temperatures, some gas turbines may include a film of cooling fluid, for example cooling air, along the turbine blades. The film of cooling fluid is usually conducted through cooling ducts located within the interior of the blade that is to be cooled, and then conducted via a multiplicity of drilled cooling holes to the outer side of the blade. The cooling holes are machined into the turbine blades at specific locations on the blade and are subject to functional requirements to provide optimal component performance and life span.

In the design stage of the turbine blades, computer aided design models of the cooling holes are sometimes generated. Typical computer aided design allows a user to construct and manipulate complex three dimensional models of objects or assemblies of objects. Moreover, the systems provide a representation of modeled objects using edges or lines, which may be represented in various manners, e.g., non-uniform rational B-splines. These systems may manage parts or assemblies of parts as modeled objects, which typically include specifications of geometry. More particularly, computer aided files contain specifications, from which geometry is generated, which in turn allow for a representation to be generated, such that the systems include graphic tools for representing the modeled objects to the designers.

Manufacturing operations prior to machining the actual cooling holes may introduce significant deviations and/or tolerances into the actual blade as opposed to the nominal design of the blade. Not adequately accounting for the non-nominal deviations in the nominal computer design may result in sub-optimal cooling hole layout which may not meet functional and/or manufacturing specifications resulting in yield loss or scrapped blades. More particularly, geometric variation in hole drilling may result in deviation of the hole true position/orientation from the nominal position/orientation. Some designers simulate the deviations from the nominal design by designing a full computer model of the entire blade. However, a full computer aided model of non-nominal components that is configured to compute functional hole parameters is expensive and time consuming.

BRIEF DESCRIPTION

A computer device for generating a computer model of a non-nominal component includes a memory device configured to store a first parameter of a nominal component and a communication interface device coupled to the memory device. The communication interface device is configured to receive a second parameter of the non-nominal component, wherein the second parameter has a different value than the first parameter. A processor is coupled to the memory device and the communication interface device. The processor is programmed to generate a nominal outer surface and a nominal inner surface; generate a tool having a first tool position; move the tool to a second tool position within the nominal component, the second tool position based on a simulated local geometric deviation of the second parameter; segment the tool into a first portion and a second portion at the nominal outer surface; return the first portion to the first tool position out of the nominal component and delete the second portion within the nominal component; segment the first portion at the nominal outer surface into a hole portion and an exterior portion; and simulate a non-nominal cooling hole represented by the hole portion to facilitate computer modeling of the non-nominal component.

In another aspect, a system for generating a computer model of a non-nominal component includes a computer device having a memory device configured to store a first parameter of a nominal component and a communication interface device coupled to the memory device and configured to receive a second parameter of the non-nominal component. The second parameter has a different value than the first parameter. A processor is coupled to the memory device and the communication interface device. The processor is programmed to: generate a nominal outer surface and a nominal inner surface; generate a tool having a first tool position; move the tool to a second tool position within the nominal component, the second tool position based on a simulated local geometric deviation of the second parameter; segment the tool into a first portion and a second portion at the nominal outer surface; return the first portion to the first tool position out of the nominal component and delete the second portion within the nominal component; segment the first portion at the nominal outer surface into a hole portion and an exterior portion; and simulate a non-nominal cooling hole represented by the hole portion. The system also includes a machining device coupled to the computer device and configured to receive a location of the non-nominal cooling hole.

A computer implemented method for generating a computer model of a component includes storing a first parameter and a second parameter of the component within a memory, wherein the second parameter has a different value than the first parameter. The method includes generating a nominal outer surface and a nominal inner surface and generating a tool having a first tool position. The tool is moved to a second tool position within the nominal component based on a simulated local geometric deviation of the second parameter. The method also includes segmenting the tool into a first portion and a second portion at the nominal outer surface. The method further includes returning the first portion to the first tool position out of the nominal component and delete the second portion within the nominal component. The first portion is segmented at the nominal outer surface into a hole portion and an exterior portion. The method includes simulating a non-nominal cooling hole represented by the hole portion within the nominal component.

DRAWINGS

These and other features, aspects, and advantages will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise. "Optional" or "optionally" means that the subsequently described event or circumstance may or may not occur, and that the description includes instances where the event occurs and instances where it does not.

As used herein, the term "computer" and related terms, e.g., "computing device", are not limited to integrated circuits referred to in the art as a computer, but broadly refers to a microcontroller, a microcomputer, a programmable logic controller (PLC), an application specific integrated circuit, and other programmable circuits and these terms are used interchangeably herein.

Further, as used herein, the terms "software" and "firmware" are interchangeable, and include any computer program stored in memory for execution by personal computers, workstations, clients and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The embodiments described herein relate to a system and methods of generating computer models of local components of gas turbine engines. More particularly, the embodiments relate to methods, systems and/or apparatus for generating a computer model of components based on nominal and non-nominal parameters of the components. It should be understood that the embodiments described herein include a variety of types of gas and/or combustion and/or rotary engines including aircraft engines and power generating engines, and further understood that the descriptions and figures that utilize gas turbine engines, blades and cooling holes are exemplary only.

Figure 1:
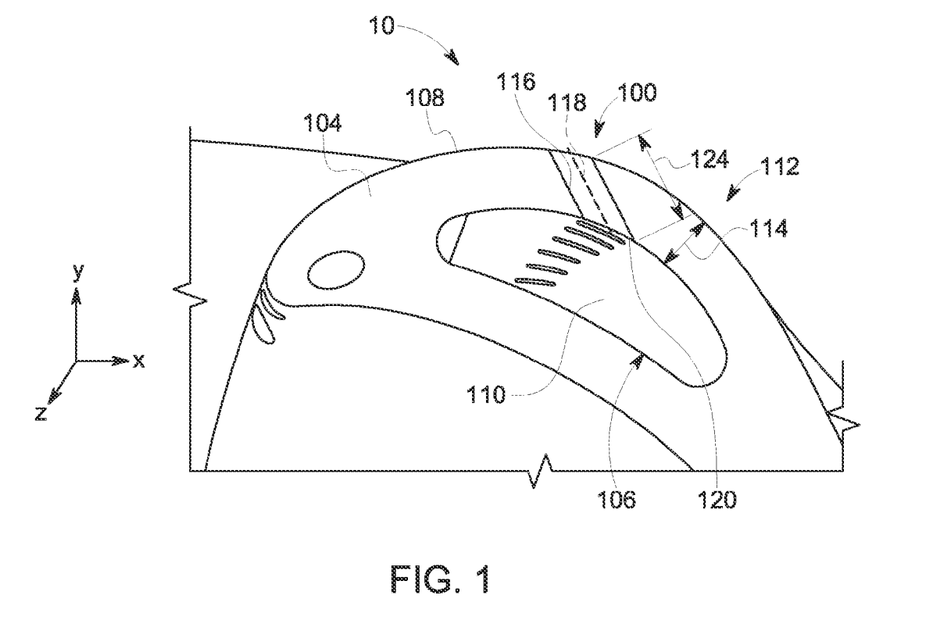
FIG. 1 is a perspective view of a computer model of a nominal component.
Figure 2:
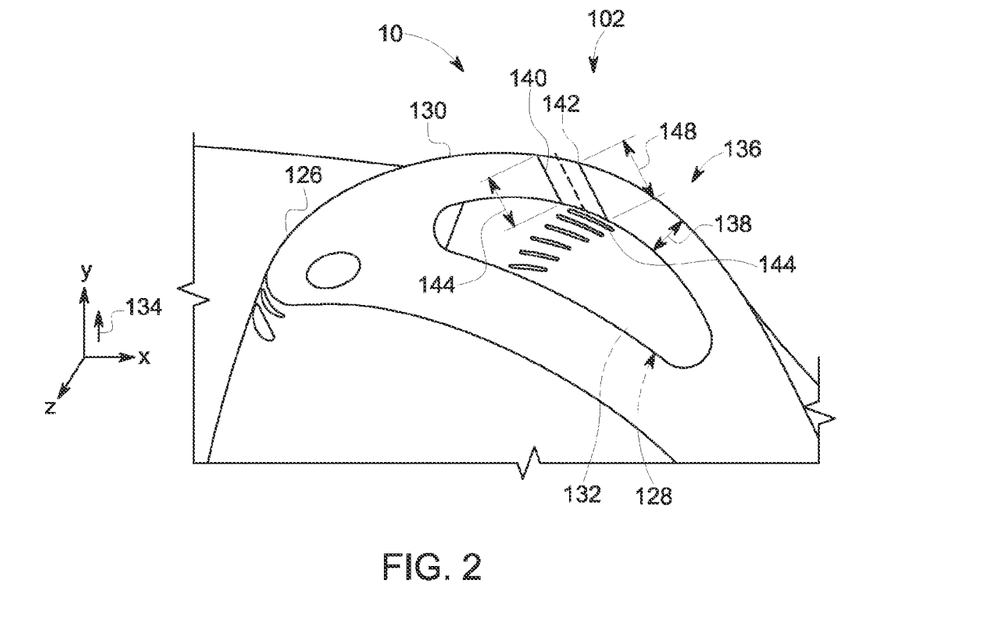
FIG. 2 is a perspective view of the computer model of the non-nominal component.

FIG. 1 is a perspective view of a computer model 10 of a nominal component 100. FIG. 2 is a perspective view of computer model 10 of a non-nominal component 102. The computer model 10 includes three perpendicular axis X, Y and Z and associated X-Y, Y-Z and X-Z planes of reference are used to define a three-dimensional Cartesian coordinate system. Nominal component 100 includes a turbine blade 104 having an inner surface 106, an outer surface 108 and an internal cavity 110 defined by inner surface 106. Turbine blade 104 includes a nominal parameter 112 such as, for example, a nominal wall thickness 114 between outer surface 108 and cavity 110. Moreover, turbine blade 104 includes a cooling hole 116 having a first end 118 and a second end 120. Second end 120 is in flow communication with cavity 110. Cooling hole 116 includes another nominal parameter 112 such as, for example, a nominal length 124 between first end 118 and second end 120. Nominal parameters 112 such as, for example, length, width, orientation, size and shape of nominal components 100 correspond to values of a design-dependent and optimized computer aided design ("CAD"). On the basis of at least nominal wall thickness 114, the dimensions of cooling hole 116 are calculated in a design stage to determine enhanced cooling fluid flow (not shown) through cooling hole 116 and an enhanced cooling film (not shown) on outer surface 108 of turbine blade 104 when cooling fluid (not shown) exits cooling hole 116, with allowance for boundary parameters over an operating range of a gas turbine engine (not shown).

Manufacturing operations prior to machining of cooling hole 116 introduces deviations into nominal component 100 as reflected in non-nominal component 102. Upstream manufacturing processes result in deviations such as, for example and without limitation, the location of cavity 110 relative to outer surface 108, deviations from the shape of cavity 110 and/or deviations from the shape of outer surface 108. More particularly, cavity 110 may shift and/or change shape and/or change orientation due to upstream manufacturing operations. Further, due to deviations of cavity 110 and/or outer surface 108, nominal wall thickness 114 may also change to a non-nominal wall thickness 138 (shown in FIG. 2).

Non-nominal component 102 includes a turbine blade 126 having an inner surface 128, an outer surface 130 and an internal cavity 132 located between inner surface 128 and outer surface 130. The non-nominal cavity 132 is shifted within turbine blade 126 relative to nominal cavity 110. More particularly, non-nominal cavity 132 is shifted a positive length 134 along the Y-axis as compared to nominal cavity 110. Turbine blade 126 includes a non-nominal parameter 136 such as, for example and without limitation, non-nominal wall thickness 138 between outer surface 130 and cavity 132. Moreover, turbine blade 126 includes a non-nominal cooling hole 140 having a first end 142 and a second end 144. Non-nominal cooling hole 140 includes different parameters such as location, orientation, size and/or shape as compared to nominal cooling hole 116. Second end 144 is in flow communication with cavity 132. Non-nominal cooling hole 140 includes another non-nominal parameter 136 such as, for example, non-nominal length 148 between first end 142 and second end 144. The non-nominal thickness 138 and non-nominal length 148 are different than nominal thickness 114 and nominal length 124 (both shown in FIG. 1), respectively. More particularly, non-nominal thickness 138 and non-nominal length 148 are less than nominal thickness 114 and nominal length 124, respectively, due to a shift of internal cavity 132 within turbine blade 126. Alternatively, non-nominal thickness 138 and non-nominal length 140 can be larger than nominal thickness 114 and nominal length 124, respectively, or substantially the same as nominal thickness 114 and nominal length 124, respectively.

When non-nominal wall thickness 138 of turbine blade 126 deviates from nominal wall thickness 114, for example as a result of manufacturing tolerances, the geometry and/or length of non-nominal cooling hole 140 produced also deviates from nominal cooling hole 116. More particularly, non-nominal cooling hole 140 becomes too short or too long relative to nominal hole 116. Manufacturing tolerances change flow conditions of cooling fluid (not shown) through non-nominal cooling hole 140 such as by having a higher and/or lower mass throughput or poorer expansion of cooling fluid (not shown) when exiting non-nominal cooling hole 140. Since nominal cooling hole 116 (shown in FIG. 1) is designed for enhanced cooling effectiveness, changes in the actual or designed geometry and/or length of cooling hole 116 (shown in FIG. 1), as reflected in non-nominal cooling hole 140, may result in less than optimal cooling effectiveness.

Figure 3:
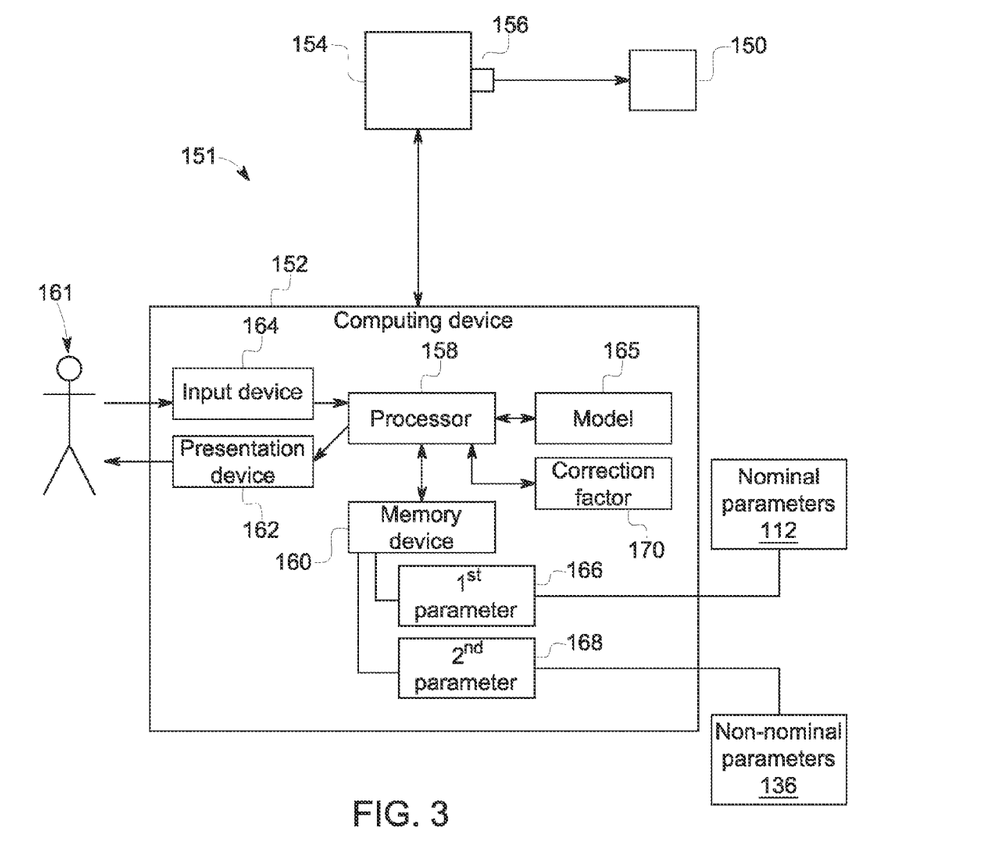
FIG. 3 is a block diagram illustrating an exemplary system having a computing device for use in computer modeling the nominal component shown in FIG. 1 and the non-nominal component shown in FIG. 2.

FIG. 3 is a block diagram illustrating a system 151 having a computing device 152 for use in localized computer modeling nominal component 100 (shown in FIG. 1) and/or non-nominal component 102 (shown in FIG. 2). Computing device 152 includes non-transitory computer-readable media having a processor 158 and a memory 160 and is loaded with a CAD application that enables operation of computing device 152 as described herein. Processor 158 includes a processing unit, such as, without limitation, an integrated circuit (IC), an application specific integrated circuit (ASIC), a microcomputer, a programmable logic controller (PLC), and/or any other programmable circuit. Processor 158 may include multiple processing units (e.g., in a multi-core configuration). Computing device 152 is configurable to perform the operations described herein by programming processor 158. For example, processor 158 may be programmed by encoding an operation as one or more executable instructions and providing the executable instructions to processor 158 in memory 160 coupled to processor 158. Memory 160 includes, without limitation, one or more random access memory (RAM) devices, one or more storage devices, and/or one or more computer readable media. Memory 160 is configured to store data, such as computer-executable instructions and parameters, such as configuration parameters and/or operating parameters. Memory 160 includes any device allowing information, such as executable instructions and/or other data, to be stored and retrieved.

Stored in memory 160 are, for example, presentation readable instructions for providing a user interface to a user 161 via a presentation device 162, receiving and processing input from an input device 164, and/or determining a correction for an exception condition. User interface may include, among other possibilities, a web browser and/or a client application. Web browsers and client applications enable users, such as user 161, to display and interact with media and other information. Exemplary client applications include, without limitation, a software application for managing one or more computing devices 152.

The computing device 152 includes at least one presentation device 162 for presenting information to user 161. Presentation device 162 includes, without limitation, a display device (not shown) (e.g., a liquid crystal display (LCD), organic light emitting diode (OLED) display, or "electronic ink" display) and/or an audio output device (e.g., a speaker or headphones). Presentation device 162 includes an output adapter (not shown), such as a video adapter and/or an audio adapter. Output adapter is operatively coupled to processor 158 and configured to be operatively coupled to an output device (not shown), such as a display device or an audio output device. Presentation device 162 includes any component capable of conveying information to user 161.

Moreover, computing device 152 includes at least one input device 164 for receiving input from user 161. Input device 164 includes, for example, a keyboard, a pointing device, a mouse, a stylus, a touch sensitive panel (e.g., a touch pad or a touch screen), a gyroscope, an accelerometer, a position detector, and/or an audio input device. A single component, such as a touch screen, may function as both an output device of presentation device 162 and input device 164. Computing device 152 can include a communication interface (not shown), which is configured to be communicatively coupled to a network. Input device 164 includes any component capable of transmitting and/or receiving information with respect to user 161.

Computing device 152 is configured to generate a local computer model 165 of nominal component 100 (shown in FIG. 1), and in particular, of nominal cooling hole 116 (shown in FIG. 1). Computing device 152 is configured to generate local computer model 165 to facilitate minimizing and/or eliminating modeling time of a full computer model of turbine blade 104 (shown in FIG. 1). Moreover, computing device 152 is configured to generate local computer model 165 to accommodate for a shift, size and/or a shape change of nominal cavity 110 (shown in FIG. 1), as reflected, for example, by non-nominal cavity 132 (shown in FIG. 2). Still further, computing device 152 is configured to generate local computer model 165 to accommodate a shift, size and/or shape change of nominal cooling hole 116 (shown in FIG. 1), as reflected, for example, by non-nominal cooling hole 140 (shown in FIG. 2).

As used herein, the term "computer model" is usable within CAD software, in which part geometry is described in terms of features, such as holes, lines, curves, chamfers, blends, radii, well defined shapes, user defined shapes, shapes from shape libraries and parameters associated with and between these features. The computer model 165 is flexible, in that nominal component 100 and/or non-nominal component 102 is described by a set of parameters, for example and without limitation, shape, location, length, width, and/or height, all of which may vary. Processor 158 is configured to alter computer model 165 by changing the value of one or more of the parameters. Moreover, components belonging to a family of components differ only with respect to the values of the parameters describing the parts or with respect to small topological changes, for example different hole sizes or positions corresponding to different machining steps.

The memory 160 includes a first parameter 166 of nominal parameters 112 such as a length, a width and shape of nominal component 100 (shown in FIG. 1). First parameter 166 is derived, for example, by engineering analysis for designing nominal component 100. Alternatively, first parameter 166 can be derived from actual measurements of an actual component (not shown). In particular, memory 160 includes first parameter 166 associated with cavity 110 and/or cooling hole 116 (shown in FIG. 1) such as, but not limited to, a length, a width, a shape, and/or an orientation of cavity 110 and/or cooling hole 116. Moreover, memory 160 includes a second parameter 168 of non-nominal parameters 136 such as a length, a width, a shape and/or an orientation of non-nominal component 102 (shown in FIG. 2). The second parameter 168 includes parameters relating to non-nominal cavity 132 and/or non-nominal cooling hole 140 (shown in FIG. 2). Second parameter 168 has a different value than first parameter 166. Alternatively, second parameter 168 can include a substantially same value of first parameter 166. The second parameter 168 is derived from a historical analysis of prior machining operations relating to prior actual components (not shown). More particularly, second parameter 168 includes tolerances and/or deviations resulting from machining operations of prior components (not shown). Alternatively, second parameter 168 can be derived from actual measurements of non-nominal component (not shown) by a measurement device (not shown) such as, for example, an ultrasound device.

Processor 158 is configured to receive second parameter 168. The processor 158 can receive second parameter 168 from a variety of sources such as, but not limited to, memory 160, a remote database (not shown), a look up table (not shown), a manual and/or a measurement device (not shown). Processor 158 is programmed to calculate a correction factor 170 based on a difference between first parameter 166 and second parameter 168. Memory 160 is configured to store correction factor 170 for analytic purposes and/or archival purposes.

Figure 4:
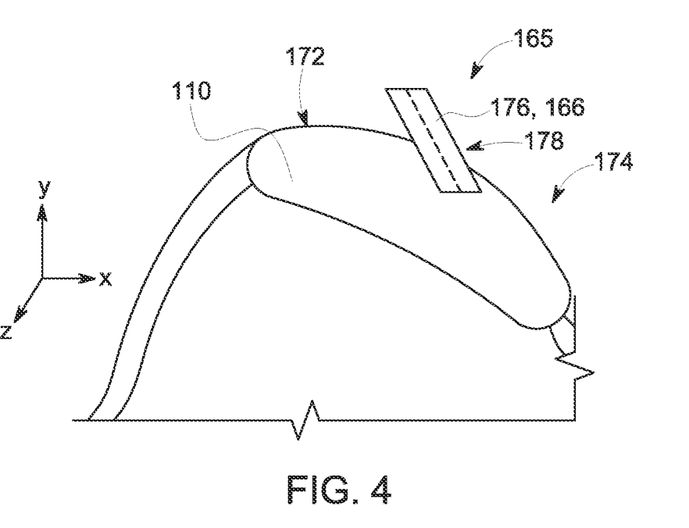
FIG. 4 is a perspective view of a computer model of a nominal component and a tool at a first position.

FIG. 4 is a perspective view of computer model 165 having a nominal component 172. The nominal component 172 includes a solid modeling of nominal cavity 110 (shown in FIG. 1). Alternatively, nominal component 172 may include a solid modeling of any component of nominal turbine blade 104 (shown in FIG. 1). Moreover, processor 158 is programmed to generate a tool 176 having first parameter 166 such as width and shape of nominal cooling hole 116 (shown in FIG. 1). Processor 158 is configured to generate a first tool position 178 which relates to nominal positioning of nominal cooling hole 116. The impact of non-nominal wall thickness 138 (shown in FIG. 2) on parameters 166 of cooling hole 116 (shown in FIG. 1) is modeled by processor 158 by conducting local shifts of cooling hole positions or cavity positions without generating a full computer model such as, for example computer model 10, of turbine blade 104 (shown in FIG. 1).

Figure 5:
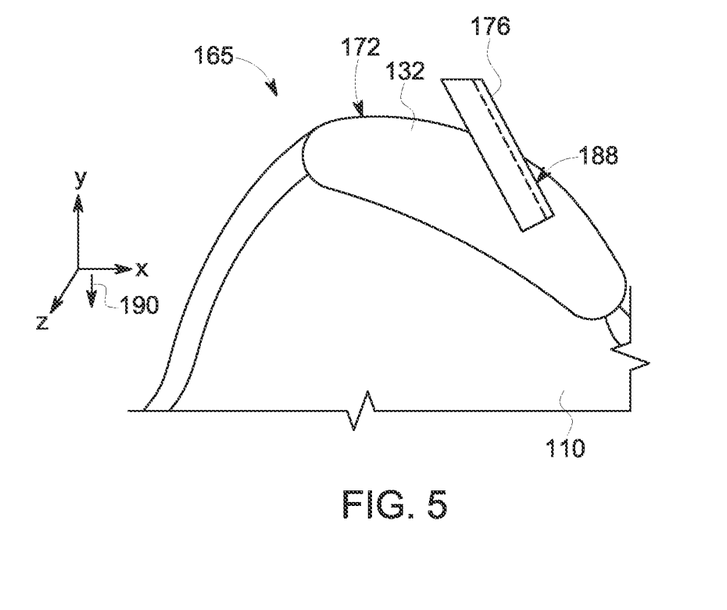
FIG. 5 is another perspective view of the computer model of the nominal component shown in FIG. 4 and the tool at a second position.

FIG. 5 is a perspective view of a computer model 165 of nominal component 172, nominal cavity 110, and of tool 176 in a second tool position 188. The a shift of non-nominal cavity 132 (shown in FIG. 2) by distance 136 (shown in FIG. 2) is simulated and computed by processor 158 shifting tool 176 to second tool position 188 within nominal component 172. More particularly, processor 158 is configured to move tool 176 to second tool position 188 by moving tool 176 a negative distance 190 along the Y-axis further into solid modeling of nominal cavity 110 of nominal component 172. Distance 190 can be based on historical information relating to machining operations and/or actual measurements of non-nominal component 102 (shown in FIG. 2). Distance 190 can be based on any information to enable computing device 152 to function as described herein.

Figure 6:
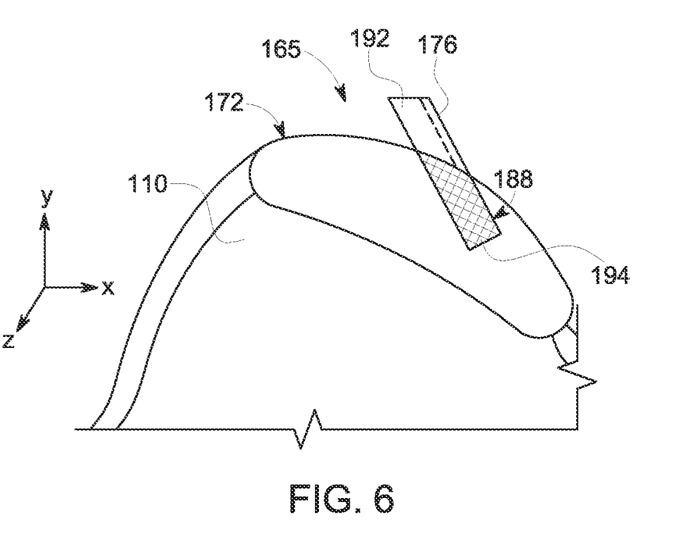
FIG. 6 is another perspective view of the computer model of the nominal component shown in FIG. 5 and the tool segmented into a first portion and a second portion.

FIG. 6 is another perspective view of computer model 165 of nominal component 172 and tool 176 split into a first portion 192 and a second portion 194. With tool 176 located within nominal component 172 and in second tool position 188, processor 158 is configured to segment tool 176 into first portion 192 and second portion 194. The first portion 192 is located outside of nominal component 172 and second portion 194 is located within nominal component 172. The since nominal component 172 includes solid modeling of nominal cavity 110, processor 158 is configured to delete second portion 194, represented by hash lines within second portion 194, since second portion 194 is moved further into a void of nominal cavity 110.

Figure 7:
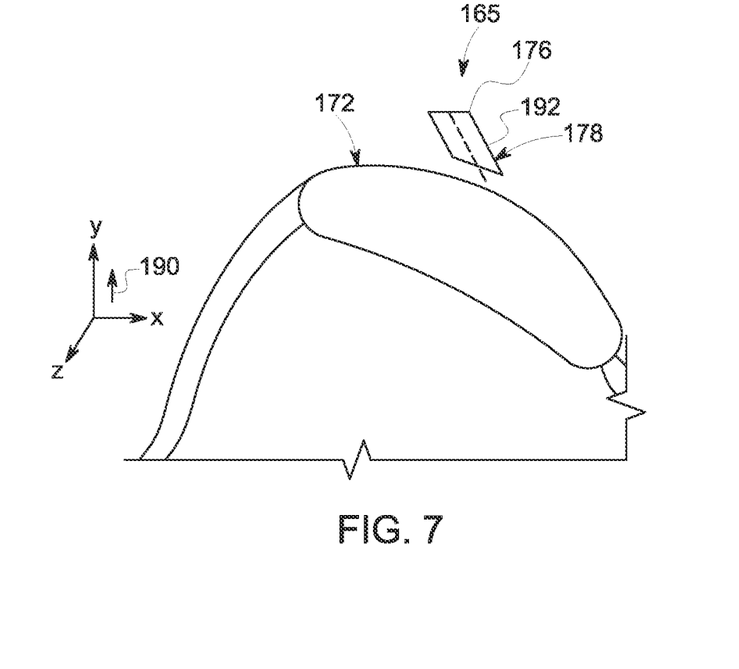
FIG. 7 is another perspective view of the computer model of the nominal component shown in FIG. 5 and the tool returned to the first position.

FIG. 7 is another perspective view of computer model 165 of nominal component 172 and tool 176 returned to first tool position 178. Processor 158 is programmed to move first portion 192 back to first tool position 178. More particularly, processor 158 is programmed to move first portion 192 to first tool position 178 away from nominal component 172 by positive distance 190 along the Y-axis. The movement of tool 176 simulates or captures the local non-nominal wall thickness 138 (shown in FIG. 2) of non-nominal turbine blade 126 (shown in FIG. 2) in the vicinity of non-nominal cooling hole 140 (shown in FIG. 2).

Figure 8:
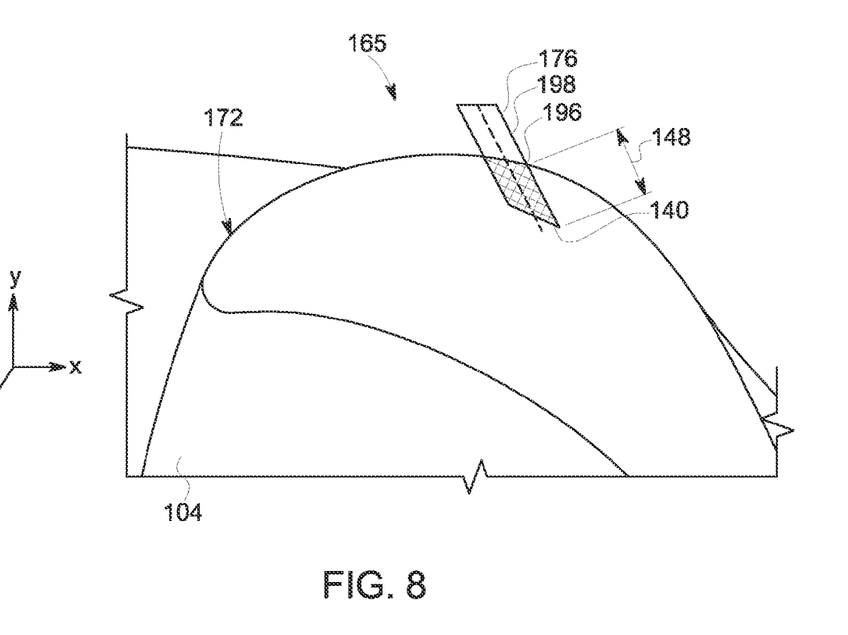
FIG. 8 is another perspective view of the computer model of the nominal component shown in FIG. 5, the tool in the first position and a nominal turbine blade.

FIG. 8 is another perspective view of computer model 165 of nominal component 172, tool 176 in first position 178, and nominal turbine blade 104. Processor 158 is configured to split tool 176 into a hole portion 196 and an exterior portion 198. Hole portion 196 is located within turbine blade 104 and exterior portion 198 is located outside of turbine blade 104. Processor 158 is configured to simulate non-nominal cooling hole 140 (shown in FIG. 2) represented by hole portion 196. Moreover, processor 158 is configured to calculate non-nominal hole length 148 based on hole portion 196. Non-nominal hole length 148 is the same or substantially the same as the length generated by full computer model 10 of turbine blade 126 (shown in FIG. 2).

Figure 9:
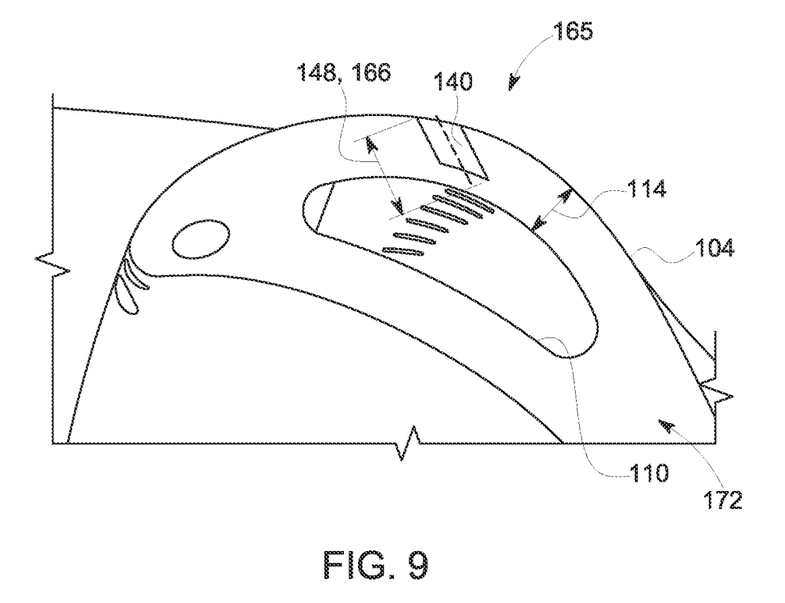
FIG. 9 is a perspective view of the computer model of the nominal turbine blade shown in FIG. 8, a nominal cavity and a non-nominal cooling hole.

FIG. 9 is another perspective view of computer model 165 of turbine blade 104, nominal cavity 110 and non-nominal cooling hole 140. The nominal cavity 110 is modeled within turbine blade 104 to form nominal thickness 114. Processor 158 is configured to delete exterior portion 198 (shown in FIG. 8) to simulate non-nominal cooling hole 140 having second parameter 168 such as non-nominal length 148.

Figure 10:
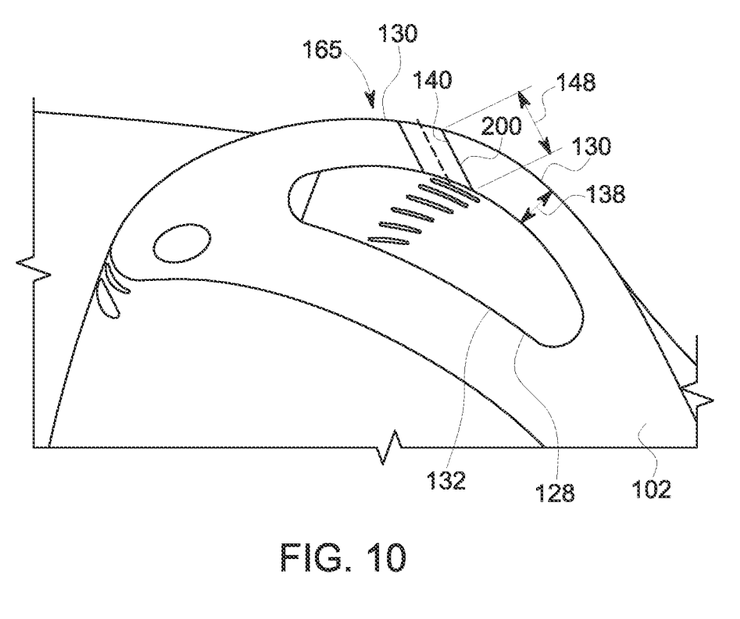
FIG. 10 is a perspective view of a computer model of a non-nominal component having a non-nominal cavity coupled in flow communication with the non-nominal cooling hole shown in FIG. 9.

FIG. 10 is another perspective view of computer model 165 of non-nominal component 102 having non-nominal cavity 132 coupled in flow communication with non-nominal hole 140. Processor 158 is configured to shift non-nominal cavity 132 based on a second parameter 168. More particularly, processor 158 is configured to shift non-nominal cavity 132 to form non-nominal wall thickness 138. Moreover, processor 158 is configured to shift non-nominal cavity 132 to couple non-nominal cavity in flow communication to non-non-nominal cooling hole 140. Simulated cooling hole 140 includes non-nominal hole parameters such as but not limited to hole length, orientation, shape, and/or width.

The non-nominal cooling hole 140 has a circular shape within nominal component 172. Alternatively, non-nominal cooling hole 140 may have other shapes such as cylindrical, non-cylindrical, and non-circular hole shapes. Non-nominal cooling hole 140 can have any shape to enable non-nominal component 102 to function. A non-circular shape such as, for example without limitation, a widening form and/or a nozzle form, may be used to facilitate directing cooling fluid (not shown) in a predetermined way from a reservoir (not shown) into non-nominal cooling hole 140. More particularly the non-circular shape facilitates directing cooling fluid through non-nominal cooling hole 140 to expand and reduce flow speed. As a consequence, cooling fluid (not shown) exiting non-nominal cooling hole 140, mixes with the mainstream flow (not shown), and optimally flows along outer surface 130, and as a result of the cooling hole shape, covers a wider region of outer surface 130 downstream of non-nominal cooling hole 140.

The processor 158 computes more efficiently and requires less computer modeling usage as compared to designing a full CAD model of turbine blade 104 (shown in FIG. 1) by moving tool 176 (shown in FIGS. 4-8) at each local vicinity of each cooling hole representing hole geometries to simulate local wall thickness deviations. Processor 158 is configured to move tool 176 to simulate a change such as a change in wall thickness 148 by moving tool 176 based on at least one of first parameter 166, second parameter 168, and correction factor 170. Moreover, processor 158 is configured to compute a geometry of non-nominal cooling hole 140 (shown in FIG. 9) based on the position of internal cavity 132 (shown in FIG. 10). More particularly, processor 158 is configured to compute size, shape, and/or orientation of cooling hole 140 (shown in in FIG. 10) in flow communication with internal non-nominal cavity 132. In the vicinity of nominal cooling hole 116 (shown in FIG. 1), processor 158 is configured to approximate non-nominal cooling hole 140 as a result of cavity shift/distortions by equivalent local shifts to nominal cavity 110 (shown in FIG. 1) to simulate an effective wall thickness. The local cavity shift by processor 158 facilitates accurate modeling of global cavity shifts and distortions more efficiently than a full non-nominal CAD model of entire turbine blade 104 (shown in FIG. 1). Processor 158 is configured to repeat moving tool 176 to facilitate simulating changes in wall thickness and compute geometries of other non-nominal cooling holes 140.

System 151 (shown in FIG. 3) includes a machining device 154 (shown in FIG. 3) coupled to computing device 152 (shown in FIG. 3). The machining device 154 includes a tool 156 (shown in FIG. 3) coupled to an actual component 150 (shown in FIG. 3). The processor 158 is configured to transmit parameters associated with non-nominal cooling hole 140 from memory 160 (shown in FIG. 3) to machining device 154 (shown in FIG. 3). Machining device 154 is configured to receive parameters associated with non-nominal cooling hole 140 and apply a tool 156 (shown in FIG. 3) against a component 150 based on at least one of first parameter 166, second parameter 168, and correction factor 170 (shown in FIG. 3). Applying tool 156 against component 150 involves one or more manufacturing steps. Manufacturing steps include a plurality of manufacturing processes, for example and without limitation, forming steps such as machining and laser steps. Manufacturing steps also include material addition steps such as, for example, deposition. Manufacturing steps include finishing steps such as, for example, shot peening and laser peening. The desired end-product of any particular step in the manufacturing process is a "shape" of non-nominal component 102 being manufactured.

Figure 11:
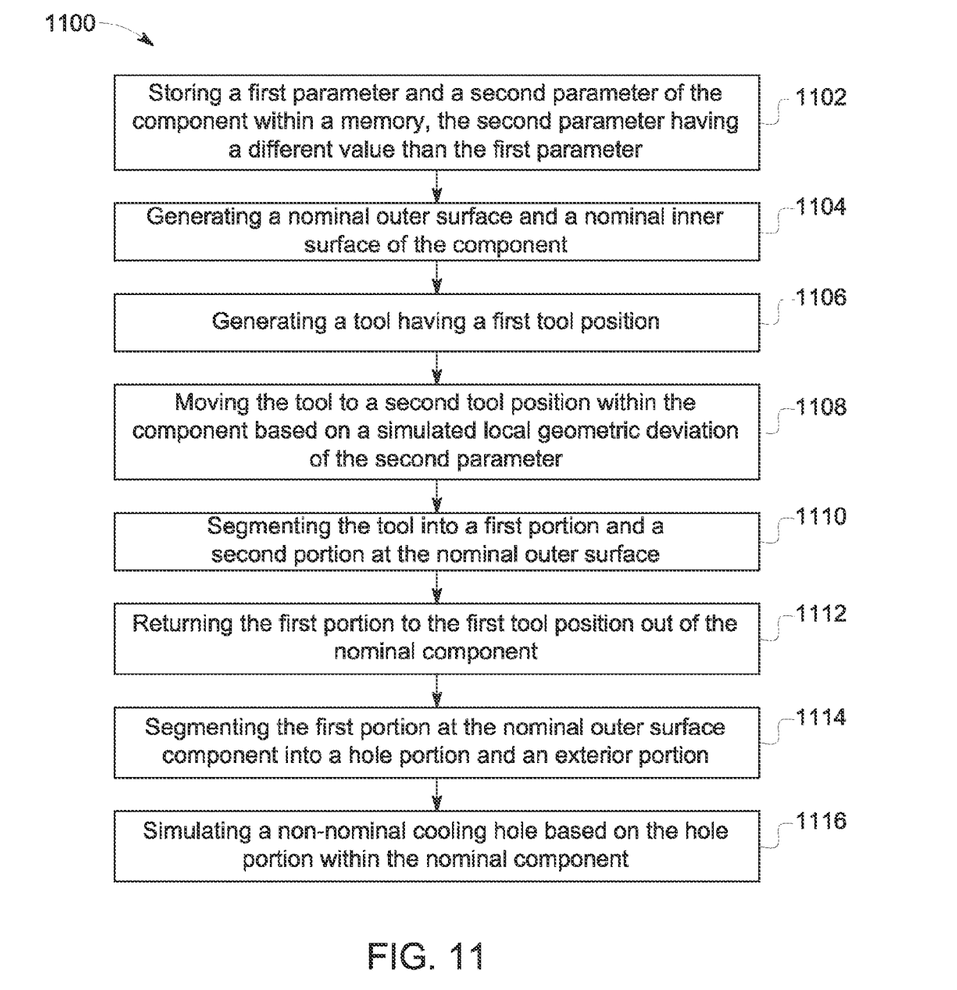
FIG. 11 is a flowchart illustrating an exemplary computer implemented method of generating a computer model of a turbine component.

FIG. 11 is a flowchart illustrating an exemplary computer implemented method 1100 of generating computer model 165 (shown in FIG. 3) of nominal component 100 (shown in FIG. 2). Method 1100 includes storing 1102 first parameter 166 (shown in FIG. 3) and second parameter 168 (shown in FIG. 3) within memory 160 (shown in FIG. 3). In the exemplary method 1100, the second parameter has a different value than the first parameter.

The method 1100 generates 1104 nominal outer surface 108 (shown in FIG. 1) and nominal inner surface 106 (shown in FIG. 1). Moreover, method 1100 includes generating 1106 tool 176 (shown in FIG. 4), wherein the tool includes first tool position 178 (shown in FIG. 4). Tool 176 is moved 1108, based on the second parameter, to second tool position 188 (shown in FIG. 5), which is within the component. Method 1100 includes segmenting 1110 the tool into first portion 192 (shown in FIG. 6) and second portion 194 (shown in FIG. 6) at the nominal outer surface. The method 1100 deletes the second portion. The first portion is returned 1112 to the first tool position out of the nominal component to simulate local wall thickness such as in the vicinity of cooling hole 16 (show in in FIG. 1). Method 1100 includes segmenting the first portion at the nominal outer surface into hole portion 196 (shown in FIG. 8) and exterior portion 198 (shown in FIG. 8). Method 1100 further includes simulating 1114 non-nominal cooling hole 140 (shown in FIG. 1) based on the position of the second portion within the nominal component.

The exemplary embodiments described herein facilitate increasing efficiency and reducing costs for generating a computer model of a component. More particularly, the exemplary embodiments described herein facilitate generating computer model parameters for enhanced design for cooling of turbine blade while accounting for manufacturing processes. More particularly, the exemplary embodiments described herein are configured to generate computer model of localized areas of a turbine blade for cooling hole layouts to account for deviations and/or tolerances caused by variations in up-stream manufacturing operations. The embodiments iteratively improve the computer modeling process at a localized area of the turbine blade for the cooling holes. Different cooling hole layouts, including hole position and angle can be iteratively examined for upstream manufacturing variation to enable robust cooling hole layout on hot gas components. If cooling fluid flows out of cooling hole at too steep an angle, cooling flow enters too far into the flow of hot gas before it is deflected to outer surface of blade. As a consequence, vortexes form to an increased extent directly downstream of cooling hole, with the effect that the hot gas reaches outer surface of blade. The effectiveness of the cooling is diminished, in particular locally, and so-called hot spots of the blade may occur, i.e., local instances of overheating of the material of the blade. Hot spots can lead to a decrease is the service life of the turbine blade. However, hot spots may also occur if the emerging flow of cooling fluid is not made to expand adequately to also sufficiently cover the intermediate region up to the cooling fluid that emerges from a neighboring cooling hole.

The flow of the cooling fluid through cooling holes and the subsequent formation as a film of cooling fluid lying against outer surface of turbine blade is determined by at least the conduction of flow through cooling hole. If, for example, excessive flow losses of the cooling fluid occur here as a result of burrs of material generated during production, too little cooling fluid flows through the cooling holes. To facilitate optimal cooling flow as cooling fluid emerges from cooling hole, cooling hole is often formed in the outlet region as a diffuser with a noncircular outlet cross section. If, however, the angle of the diffuser opening or the noncircular widening does not correspond here to the nominal geometrical specifications, there may be an inappropriate outflow of cooling fluid.

A technical effect of the systems and methods described herein includes at least one of: (a) generating a computer model of a localized area of a component; (b) accounting for manufacturing deviations of the component during a computer modeling stage; (c) iteratively improving a computer aided design process by a computer model; (d) generating an optimal cooling hole layout for the component; and (e) increasing efficiency and decreasing costs for computer modeling of components.

The term "processor" is not limited to just those integrated circuits referred to in the art as a computer, but broadly refers to a microcontroller, a microcomputer, a programmable logic controller (PLC), an application specific integrated circuit, and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, the additional output channels may include, but not be limited to, an operator interface monitor. The above examples are exemplary only, and thus are not intended to limit in any way the definition and/or meaning of the term processor.

Exemplary embodiments of a computing device and computer implemented methods for generating a computer model of a component are described herein. The methods and systems are not limited to the specific embodiments described herein, but rather, components of systems and/or steps of the methods may be utilized independently and separately from other components and/or steps described herein. For example, the methods may also be used in combination with other manufacturing systems and methods, and are not limited to practice with only the systems and methods as described herein. Rather, the exemplary embodiment may be implemented and utilized in connection with many other engine applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for generating a non-nominal component, said system comprising:
    a memory device configured to store a first parameter of a nominal component;
    a communication interface device coupled to said memory device and configured to receive a second parameter of the non-nominal component, the second parameter having a different value than the first parameter;
    a processor coupled to said memory device and said communication interface device, said processor programmed to:
        generate a nominal outer surface and a nominal inner surface;
        generate a tool having a first tool position;
        move said tool to a second tool position within the nominal component, said second tool position based on a simulated local geometric deviation of said second parameter;
        segment said tool into a first portion and a second portion at said nominal outer surface;
        return said first portion to the first tool position out of said nominal component and delete said second portion within said nominal component;
        segment said first portion, at said nominal outer surface, into a hole portion and an exterior portion; and
        simulate a non-nominal cooling hole represented by said hole portion to generate a computer model of the non-nominal component; and
    a machining device configured to receive a location of said non-nominal cooling hole and to deposit material on the non-nominal component.

2. The system of claim 1, wherein the first parameter of the nominal component comprises a nominal parameter of the nominal component comprising at least one of a length, width, orientation, and shape of a nominal cooling hole.

3. The system of claim 1, wherein the second parameter of the non-nominal component comprises a non-nominal parameter of the non-nominal component comprising at least one of a length, width, orientation, and shape of said non-nominal cooling hole.

4. The system of claim 1, wherein said memory device is configured to store the second parameter.

5. The system of claim 1, wherein said non-nominal cooling hole has at least one of a circular shape, a cylindrical shape, and a non-cylindrical shape.

6. The system of claim 1, wherein said processor is configured to delete said exterior portion.

7. The system of claim 1, wherein said processor is configured to generate a nominal cavity within the nominal component.

8. The system of claim 1, wherein said processor is configured to simulate the non-nominal cooling hole represented by said hole portion to facilitate computer modeling of the non-nominal component.

9. The system of claim 1, wherein the first parameter comprises a nominal parameter and the second parameter comprises a non-nominal parameter.

10. The system of claim 1, wherein said machining device is configured to apply said tool against the non-nominal component based on the location of said non-nominal cooling hole.

11. The system of claim 1, wherein the machining device is further configured to shot peen the non-nominal component.

12. The system of claim 1, wherein the machining device is further configured to laser peen the non-nominal component.

* * * * *